(12) United States Patent
Satou et al.

(10) Patent No.: US 11,245,248 B2
(45) Date of Patent: Feb. 8, 2022

(54) SEMICONDUCTOR LASER

(71) Applicant: SONY SEMICONDUCTOR SOLUTIONS CORPORATION, Kanagawa (JP)

(72) Inventors: Shinya Satou, Miyagi (JP); Hideto Iki, Miyagi (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 11 days.

(21) Appl. No.: 16/959,528

(22) PCT Filed: Oct. 19, 2018

(86) PCT No.: PCT/JP2018/038975
§ 371 (c)(1),
(2) Date: Jul. 1, 2020

(87) PCT Pub. No.: WO2019/138635
PCT Pub. Date: Jul. 18, 2019

(65) Prior Publication Data
US 2021/0066886 A1    Mar. 4, 2021

(30) Foreign Application Priority Data
Jan. 10, 2018  (JP) .............................. JP2018-002115

(51) Int. Cl.
*H01S 5/00* (2006.01)
*H01S 5/16* (2006.01)
(Continued)

(52) U.S. Cl.
CPC .............. *H01S 5/162* (2013.01); *H01S 5/026* (2013.01); *H01S 5/1003* (2013.01);
(Continued)

(58) Field of Classification Search
CPC ........ H01S 5/1064; H01S 5/026; H01S 5/162; H01S 5/1003; H01S 5/16; H01S 5/22; H01S 5/2086
See application file for complete search history.

(56) References Cited

U.S. PATENT DOCUMENTS 5,987,046 A * 11/1999 Kobayashi ......... G02B 6/12004
                                                    372/45.01
6,219,366 B1 * 4/2001 Furushima ................ H01S 5/10
                                                    372/45.01
(Continued)

FOREIGN PATENT DOCUMENTS

CN           104995805 A        10/2015
CN           106575854 A         4/2017
(Continued)

OTHER PUBLICATIONS

International Search Report and Written Opinion of PCT Application No. PCT/JP2018/038975, dated Jan. 8, 2019, 11 pages of ISRWO.

*Primary Examiner* — Kinam Park
(74) *Attorney, Agent, or Firm* — Chip Law Group (57) ABSTRACT

A semiconductor laser includes a semiconductor layer including end faces and at least one of the end faces is configured as a light emission end face. The semiconductor layer includes a waveguide and a light window structure region. The waveguide has a first width and is extended between the end faces. The light window structure region includes an opening having a second width greater than the first width arranged along the waveguide and is formed continuously or intermittently from one to another of the end faces.

14 Claims, 10 Drawing Sheets

(51) Int. Cl.
*H01S 5/026* (2006.01)
*H01S 5/10* (2021.01)
*H01S 5/22* (2006.01)
*H01S 5/20* (2006.01)

(52) U.S. Cl.
CPC .............. *H01S 5/1064* (2013.01); *H01S 5/16* (2013.01); *H01S 5/22* (2013.01); *H01S 5/2086* (2013.01)

(56) References Cited

U.S. PATENT DOCUMENTS

| | | | | |
|---|---|---|---|---|
| 6,226,310 | B1* | 5/2001 | Takagi | H01S 5/0265 372/50.11 |
| 10,547,159 | B1* | 1/2020 | Holly | H01S 5/0424 |
| 2002/0015428 | A1* | 2/2002 | Fukunaga | H01S 5/164 372/46.01 |
| 2007/0153857 | A1* | 7/2007 | Chua | G02B 6/1228 372/49.01 |
| 2015/0349495 | A1* | 12/2015 | Kinugawa | H01S 5/162 438/31 |
| 2017/0149214 | A1* | 5/2017 | Taniguchi | H01S 5/4031 |

FOREIGN PATENT DOCUMENTS

| | | |
|---|---|---|
| JP | 10-290043 A | 10/1998 |
| JP | 11-026866 A | 1/1999 |
| JP | 2001-135895 A | 5/2001 |
| JP | 2001-185809 A | 7/2001 |
| JP | 2006-108225 A | 4/2006 |
| JP | 2014-110250 A | 6/2014 |
| WO | 2014/126164 A1 | 8/2014 |
| WO | 2016/024609 A1 | 2/2016 |

* cited by examiner

SEMICONDUCTOR LASER

CROSS REFERENCE TO RELATED APPLICATIONS

This application is a U.S. National Phase of International Patent Application No. PCT/JP2018/038975 filed on Oct. 19, 2018, which claims priority benefit of Japanese Patent Application No. JP 2018-002115 filed in the Japan Patent Office on Jan. 10, 2018. Each of the above-referenced applications is hereby incorporated herein by reference in its entirety.

TECHNICAL FIELD

The present technology relates to a semiconductor laser.

BACKGROUND ART

Patent Literature 1 discloses a semiconductor laser having a structure that less current is injected into an interdiffusion region that is a window structure region of resonator end faces of an active layer. In the semiconductor laser, an injection region of Zn ions and Si ions forms the window structure region, which inhibits degradation leading to end face destruction of a device due to light absorption (for example, specification paragraphs [0018] and [0041], and FIGS. 5A, 5B, 5C, 5D, 6A, 6B, 7A, 7B, 8A, and 8B).

CITATION LIST

Patent Literature

Patent Literature 1: Japanese Patent Application Laid-open No. 11-26866

DISCLOSURE OF INVENTION

Technical Problem

Along with a high output of laser light, the degradation of the device due to the light absorption is more concerned. On the other hand, if the window structure region is set in a wide range in order to inhibit the degradation of the device, free carrier absorption is increased, which may decrease light emission efficiency.

An object of the present disclosure is to provide a semiconductor laser that can inhibit the decrease in the light emission efficiency and the degradation of the device.

Solution to Problem

A semiconductor laser according to an embodiment includes a semiconductor layer that includes end faces and at least one of the end faces is configured as a light emission end face.

The semiconductor layer includes a waveguide and a light window structure region.

The waveguide has a first width and is extended between the end faces.

The light window structure region includes an opening having a second width greater than the first width arranged along the waveguide and is formed continuously or intermittently from one to another of the end faces.

As described above, by the light window structure region formed continuously or intermittently from one to another of the end faces, the light absorption in a region extending in the vertical direction from the semiconductor layer, in particular, the ridge waveguide can be inhibited. Thus, degradation of the semiconductor layer can be inhibited. On the other hand, the opening of the window structure region has a width (second width) greater than the width (first width) of the waveguide. Thus, absorption of free carriers can be inhibited and a decrease in light emission efficiency can be inhibited.

The semiconductor layer may include an active layer, a first clad layer arranged at a substrate side, and a second clad layer arranged at an opposite side of the first clad layer with respect to the active layer.

The window structure region may be arranged in a depth that reaches from the second clad layer to the first clad layer via the active layer.

Alternatively, the semiconductor layer may have a guide layer between the first clad layer and the active layer and/or between the first clad layer and the active layer.

The waveguide may be a ridge waveguide. A convex part of the ridge waveguide is formed by a dry etching process, for example. In that case, defects become likely to be generated in the region extending in the vertical direction of the ridge waveguide. However, by the window structure region according to the embodiment, degradation of the semiconductor layer based on the defects can be inhibited.

The ridge waveguide may have tapered or reverse tapered side faces extended from one to another of the end faces.

The semiconductor layer may have a concave part pair formed by sandwiching the ridge waveguide along the ridge waveguide. With this configuration, a height position of the ridge waveguide can be identical to a surface position of the semiconductor layer on which no concave part is formed. Accordingly, stress concentration on the ridge waveguide can be relaxed when the semiconductor laser is mounted to a circuit board.

The semiconductor layer may further have a high resistance layer. The high resistance layer may be arranged along the waveguide, formed continuously or intermittently from one to another of the end faces, and arranged in the second clad layer of the window structure region from a surface opposite to a side in which the active layer is arranged to a position shallower than the active layer. With this configuration, a leak current to the window structure region can be inhibited.

The semiconductor layer may be configured to match a center of the waveguide in a width direction with a center of the opening in a width direction.

The first width that is a width of the ridge waveguide may be 0.5 μm or more and 5 μm or less. The second width may be 5 μm or more and 40 μm or less.

The high resistance layer may have an opening arranged so as to overlap with the opening of the window structure region.

A width of the opening of the high resistance layer may be identical to a width of the opening of the window structure region. Alternatively, the width of the opening of the high resistance layer may be smaller than the width of the opening of the window structure region. With this configuration, an inhibition effect of the leak current to the window structure region can be enhanced.

The high resistance layer may include at least one of Si, B, or H.

The window structure region may be a Zn diffusion region.

Advantageous Effects of Invention

As described above, according to the present technology, the decrease in the light emission efficiency and the degradation of the device can be inhibited.

It should be noted that the effects described here are not necessarily limitative and may be any of effects described in the present disclosure.

MODE(S) FOR CARRYING OUT THE INVENTION

Hereinafter, embodiment of the present technology will be described with reference to the drawings.

1. Reference Embodiment

Figure 1:
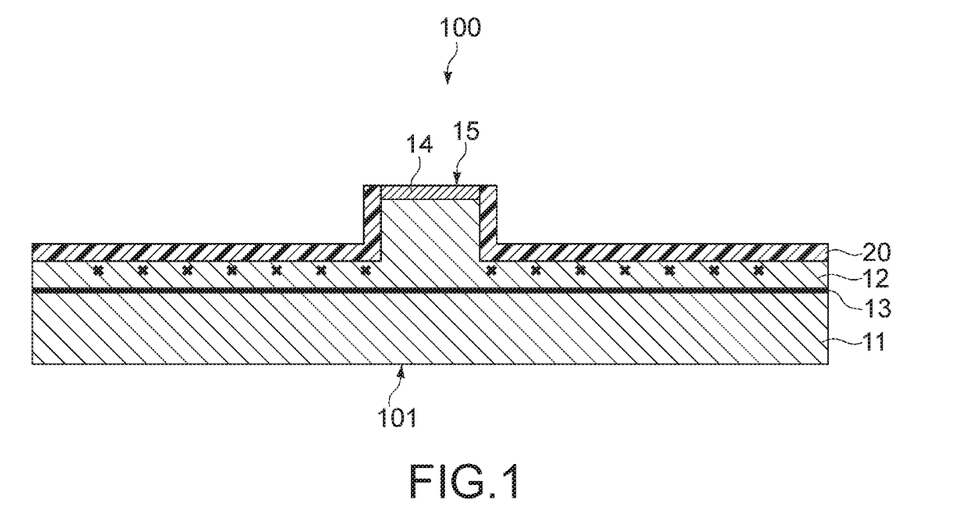
FIG. 1 is a cross-sectional view of a semiconductor layer 101 of a semiconductor laser having a basic structure according to a reference embodiment

FIG. 1 is a cross-sectional view of a semiconductor layer 101 of a semiconductor laser having a basic structure according to a reference embodiment. The semiconductor layer 101 of the semiconductor laser 100 has a first clad layer 11, an active layer 13, a second clad layer 12, and a contact layer 14 in order from a substrate (not shown) side. An insulation film 20 is formed on a surface of the semiconductor layer 101 excluding the contact layer 14.

The semiconductor laser 100 is a ridge waveguide type semiconductor laser having, for example, a ridge waveguide 15. In order to provide the waveguide and side regions of the waveguide with an effective refractive index difference, the second clad layer 12 is etched and removed halfway at the sides of the waveguide, and the ridge waveguide 15 is thus formed in a convex shape.

For example, etching is performed by a dry etching process such as an RIE (Reactive Ion Etching). In this case, as shown by "×" in FIG. 1, defects are introduced into the second clad layer 12 or the active layer 13 at the sides of the waveguide 15, light absorption is generated when applying an electrical current, and the semiconductor layer 101 may be degraded.

2. Embodiment 1

2. 1) Structure of Semiconductor Laser

Figure 2:
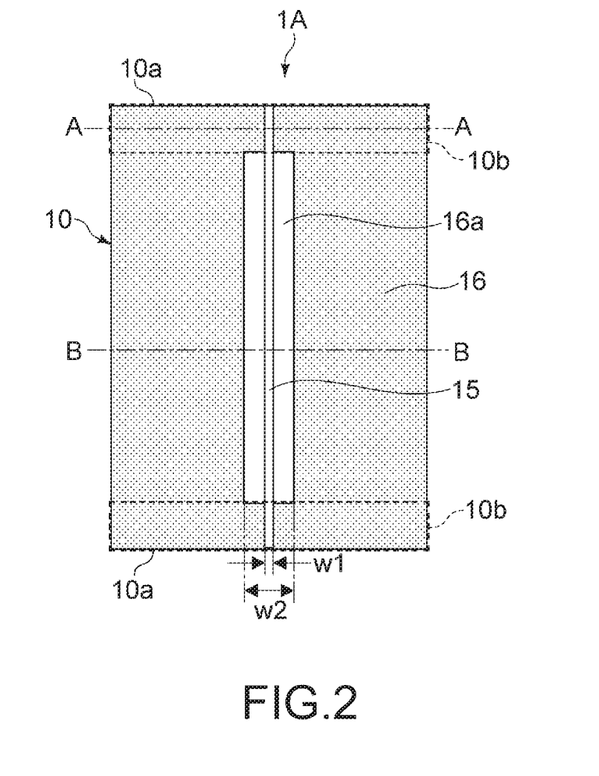
FIG. 2 is a plan view showing the semiconductor layer of the semiconductor laser according to an embodiment 1 of the present technology.
Figure 3A:
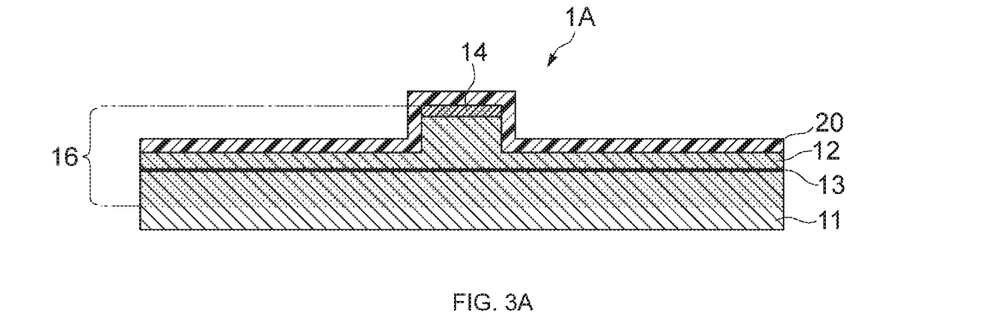
FIG. 3A is a cross-sectional view taken along the line A-A of FIG. 2 and FIG. 3B a cross-sectional view taken along the line B-B of FIG. 2.

FIG. 2 is a plan view showing the semiconductor layer of the semiconductor laser according to an embodiment 1 of the present technology. FIG. 3A is a cross-sectional view taken along the line A-A of FIG. 2 and FIG. 3B a cross-sectional view taken along the line B-B of FIG. 2. A basic structure of the semiconductor laser 1A is similar to the structure of the semiconductor laser 100 according to the reference embodiment shown in FIG. 1.

At least one of the end faces 10a of the semiconductor layer 10 is configured as a laser light emission end face. The ridge waveguide 15 is extended between the end faces 10a and is, for example, extended substantially in a vertical direction with respect to the end faces 10a.

The semiconductor layer 10 has a window structure region 16 continuously formed from one to another of the end faces 10a. The window structure region 16 is a Zn diffusion region for inhibiting the light absorption as described above. The window structure region 16 has an opening 16a arranged along the ridge waveguide 15 (also see FIG. 3B). The phrase "along the ridge waveguide 15" means that the opening 16a is arranged along a length direction (longitudinal direction in FIG. 2) of an optical resonator configuring the semiconductor layer 10 and overlapped with the ridge waveguide 15 in a planar view. The opening 16a is a non-window structure region.

At both ends (near end faces 10a) of the semiconductor layer 10 of FIG. 2, for example, no opening 16a is formed and the window structure region 16 is formed all over the both ends. In other words, the length of the opening 16a in the length direction of the optical resonator is made shorter than the length of the semiconductor layer 10 in the same direction (i.e., optical resonator length) and the length of the ridge waveguide 15. For example, the length of opening 16a in the optical resonator direction is set to about 80 to 99%, more preferably 90 to 99% of that of the semiconductor layer 10 in the same direction.

Note that a distance from the end faces 10a of the semiconductor layer 10 to, for example, about 1 to 20%, more preferably about 1 to 10% inside the optical resonator length can also be defined as an "end face region". In FIG. 2, each end face region 10b is a region surrounded by a broken line.

As shown in FIG. 3A, the window structure region 16 is arranged in a depth that reaches from at least a surface of the second clad layer 12, here a surface of the contact layer 14, to the first clad layer 11 (for example, halfway to first clad layer 11) via the active layer 13. A bandgap of the active layer 13 included in the window structure region 16 will be greater than a bandgap of the active layer 13 not included in the window structure region 16.

Figure 3B:
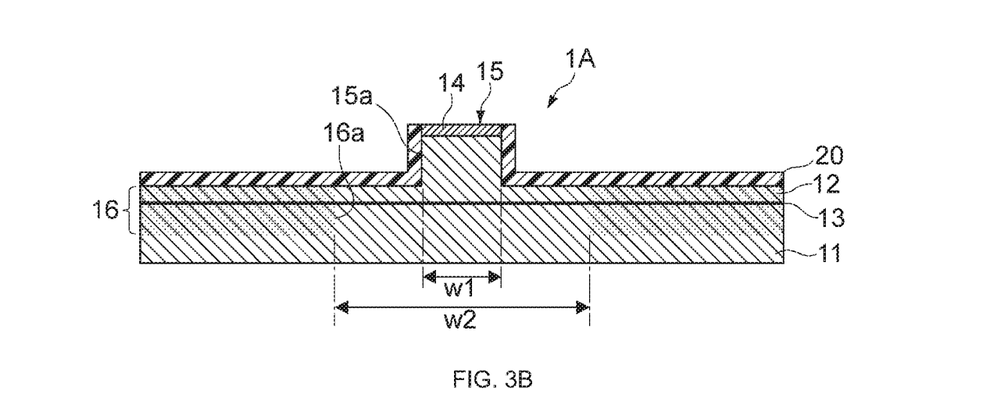

As shown in FIG. 3B, a width w2 (second width) of the opening 16a is formed greater than a width w1 (first width) of the ridge waveguide 15. Herein, the width refers to a width in directions orthogonal to both of the optical resonator length direction and the depth direction (lamination direction of each layer of semiconductor). The width direction may be conveniently hereinafter referred to as a "horizontal direction". The width w1 of the ridge waveguide 15 is a width of a convex part and is substantially identical to a width of the contact layer 14.

A direction along side faces (side faces extended from one to another of end faces 10a) 15a of the ridge waveguide may be matched with a lamination direction of each layer of the semiconductor, i.e., may be a vertical direction with respect to the horizontal direction, or the side faces may be formed in taper shapes (faces directing diagonally upward) or reverse taper shapes (faces directing diagonally downward). In other words, in a case where the ridge waveguide is not a rectangle or a square such as, for example, a trapezoid, the width of the ridge waveguide takes a value that changes depending on a height (depth) position of the trapezoid. Thus, in a case where the ridge waveguide is the trapezoid, the width of the opening 16a is made greater than a maximum value of the width of the ridge waveguide.

A center of the waveguide 15 in the width direction is typically matched with a center of the opening 16a in the width direction. However, they may not be matched with and respective distances from the center of the ridge waveguide 15 to respective ends of the opening 16a in the width direction may be different.

The width of the ridge waveguide 15 is, for example, 0.5 µm or more and 5 µm or less, more preferably 1 µm or more and 3 µm or less. The width of the opening 16a may be, for example, 5 µm or more and 40 µm or less, more preferably 10 µm or more and 30 µm or less.

Note that, in a case where the semiconductor laser 1A is a device using an AlGaAs-based material, n-GaAs is used for the substrate, n-AlGaAs is used for the first clad layer 11, AlGaAs is used for the active layer 13, p-AlGaAs is used for the second clad layer 12, and GaAs is used for the contact layer 14, for example, as materials.

Alternatively, a semiconductor material in which the first clad layer 11 is in a p type and a second clad layer 12 is n type may be used on the contrary.

As described above, according to this embodiment, the light window structure region 16 continuously formed from one to another of the end faces 10a of the semiconductor layer 10 inhibits the light absorption in a region extending in the vertical direction from the ridge waveguide 15.

Since Zn is diffused in the window structure region 16, an impurity concentration of the window structure region 16 is higher than that of the non-window structure region. If no opening 16a is arranged, the window structure region 16 having a high impurity concentration will be overlapped with a light emission region, which may cause an increase in absorption of free carriers and light emission efficiency may be decreased. In this embodiment, the window structure region 16 is formed at a certain distance from the ridge waveguide 15 in the vertical distance. In other words, by arranging the opening 16a having the width w2 greater than the width w1 of the ridge waveguide 15, the window structure region 16 having the high impurity concentration is formed apart from the light emission region. Thus, it is possible to inhibit a decrease in the light emission efficiency.

In particular, since the semiconductor laser 1A according to this embodiment is a ridge waveguide type, defects become likely to be generated in the region extending in the vertical direction from the ridge waveguide 15 in manufacturing processes, as shown in FIG. 1. However, by arranging the window structure region 16, degradation and destruction of the semiconductor layer 10 based on the defects can be inhibited during an operation of the semiconductor laser 1A.

As electric resistance of the window structure region 16 is lower than other regions of the semiconductor layer 10, the window structure region 16 is formed from sides of the ridge waveguide 15, which may results in an increase in a leak current. However, the window structure region 16 having the opening 16a according to this embodiment can inhibit such leak current. As a result, increases in a threshold current and an operating current can be inhibited.

A band gap of the active layer 13 of the window structure region 16 is greater than that of a general quantum well active layer. Accordingly, if the certain distance is not kept from the ridge waveguide 15 in the vertical direction, no light emission recombination does not occur in the side regions of the ridge waveguide 15, there is a risk to affect a size and a shape of a radiation angle of laser light. However, the window structure region 16 according to this embodiment can avoid the risk by having the opening 16a formed in a predetermined range.

2. 2) Manufacturing Processes of Semiconductor Laser

FIGS. 4A, 4B, 4C, 4D, 4E, 5A, 5B, 5C, and 5D shows the manufacturing processes of the semiconductor laser 1A in order. Each of these figures corresponds to a cross-sectional view at a cross-section position taken along the line B-B of FIG. 2. No substrate is shown.

Figure 4A:
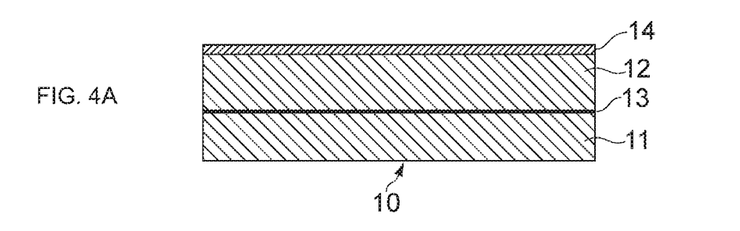
FIGS. 4A, 4B, 4C, 4D, and 4E FIGS. 4A, 4B, 4C, 4D, and 4E show manufacturing processes of the semiconductor laser according to the embodiment 1 in order.

As shown in FIG. 4A, the first clad layer 11, the active layer 13, the second clad layer 12, and the contact layer 14 are formed on the substrate in order by crystal growth. As a crystal growth method, MOCVD (Metal Organic Chemical Vapor Deposition) is used, for example.

Figure 4B:
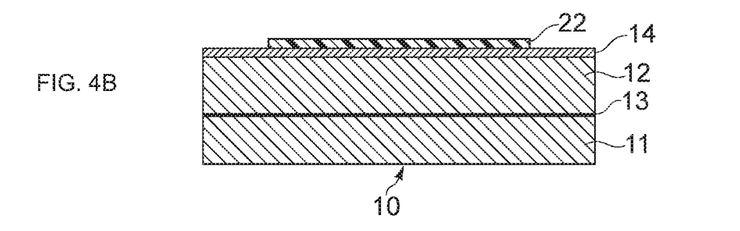

As shown in FIG. 4B, an insulation film is formed on the contact layer 14, and a part of the insulation film in which the window structure region 16 is desirably formed is removed. As a result, the insulation film 22 remains. The insulation film 22 is formed, for example, by CVD similar to the following other insulation films, but may be formed by other methods.

Figure 4C:
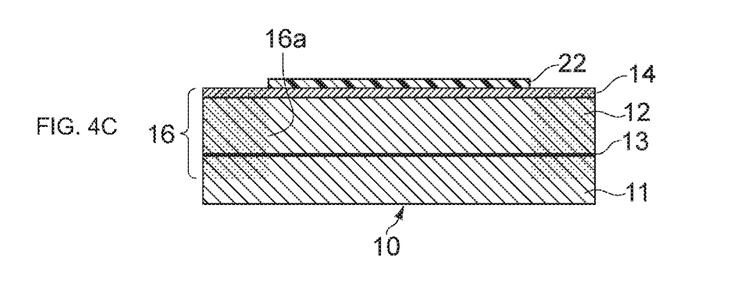
Figure 4D:
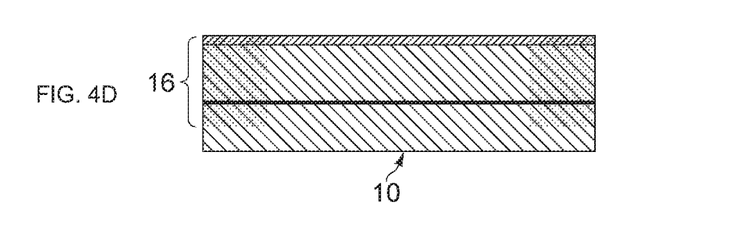

As shown in FIG. 4C, Zn is diffused halfway to the first clad layer 11 by using the insulation film 22 as a mask. As shown in FIG. 4D, the insulation film 22 is removed.

Figure 4E:
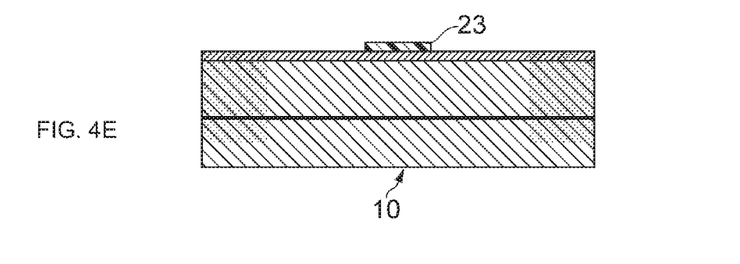
Figure 5A:
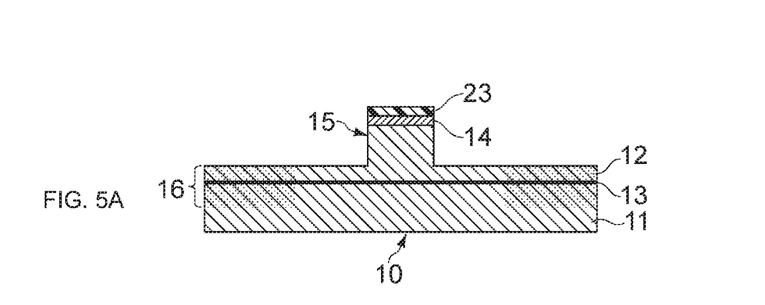
FIGS. 5A, 5B, 5C, and 5D show the manufacturing processes of the semiconductor laser according to the embodiment 1 in order followed by FIG. 4E.

As shown in FIG. 4E, an insulation film 23 is formed. As shown in FIG. 5A, a part of the contact layer 14 and a part of the second clad layer 12 are removed by etching to a predetermined depth of the second clad layer 12 by using the insulation film 23 as a mask. Thus, the convex part configuring the ridge waveguide 15 is formed. As the etching, the dry etching is used as described above.

Figure 5B:
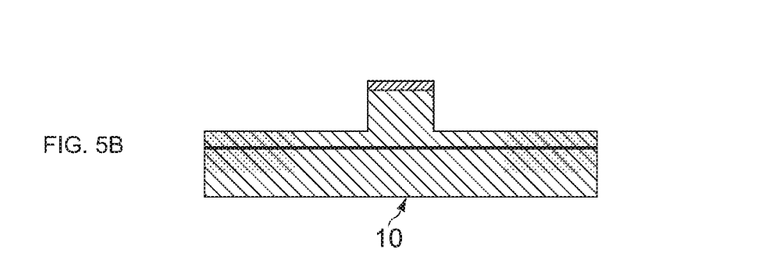
Figure 5C:
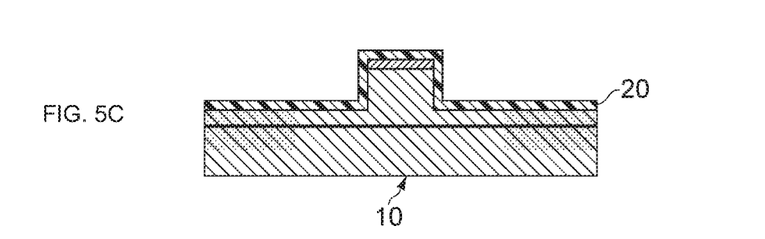

As shown in FIG. 5B, the insulation film 23 is removed. As shown in FIG. 5C, the insulation film 20 is formed on an upper face of the semiconductor layer 10.

Figure 5D:
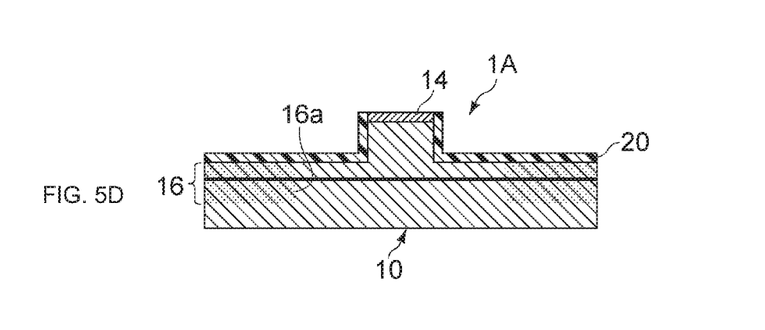

As shown in FIG. 5D, the insulation film 20 on the contact layer 14 is removed. Thereafter, an electrode layer (not shown) is formed on the contact layer 14 by vapor deposition or sputtering. In addition, electrodes are formed at a substrate side by the same method. In the above-described way, the semiconductor laser 1A is formed.

3. Embodiment 2

Figure 6A:
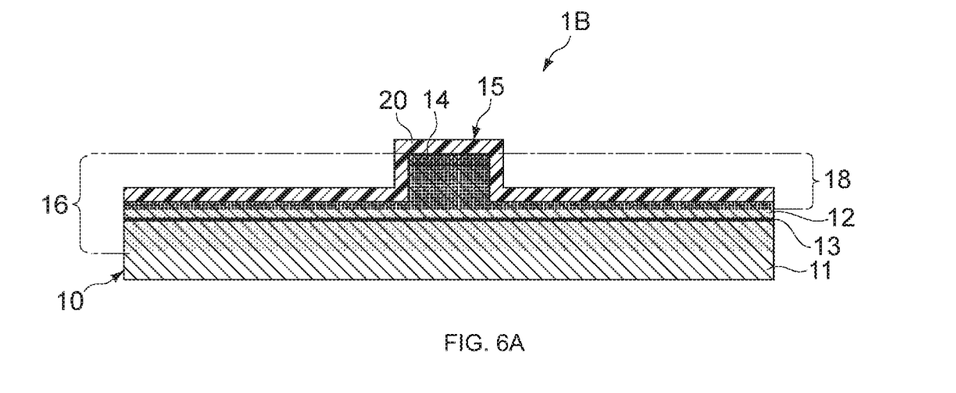
FIG. 6A shows a cross-section of an end face region of a semiconductor layer of a semiconductor laser according to an embodiment 2.
Figure 6B:
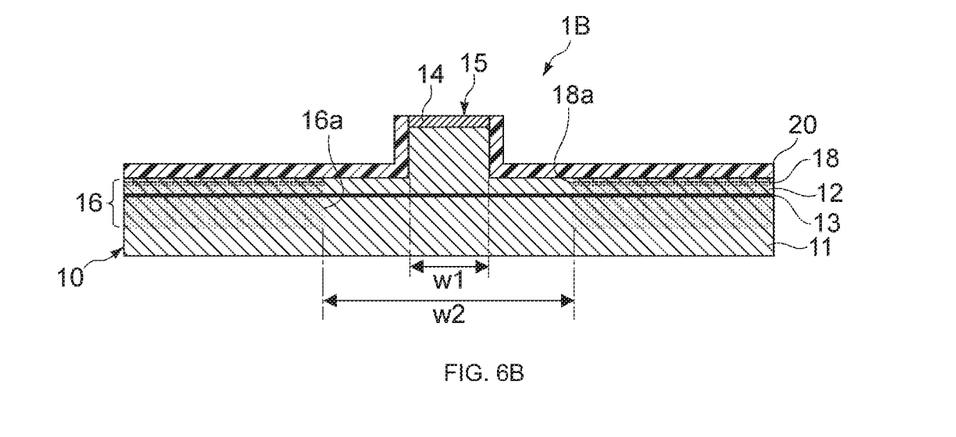
FIG. 6B shows a cross-section excluding the end face region of the semiconductor layer.

FIGS. 6A and 6B are cross-sectional views showing a semiconductor laser according to an embodiment 2, respectively. FIG. 6A shows a cross-section of the end face region 10b of the semiconductor layer 10 (see FIG. 2) similar to FIG. 3A. FIG. 6B shows a cross-section excluding the end face region 10b of the semiconductor layer 10 similar to FIG. 3B.

In the description hereinafter, substantially same components as the components described in the above-described reference embodiment and the embodiment 1 are denoted by the same reference signs, description thereof will be omitted or simplified, and different points will be mainly described.

As compared to the semiconductor layer 10 according to the embodiment 1, the semiconductor layer 10 of a semiconductor laser 1B further includes a high resistance layer 18. The high resistance layer 18 is arranged in the window structure region 16 from a surface at an opposite side in which the active layer 13 is arranged, i.e., a surface of the contact layer 14 in this embodiment, of the second clad layer 12 to a position shallower than the active layer 13. By arranging the high resistance layer 18 as near as possible to the active layer 13, an inhibition effect of the leak current to the window structure region 16 can be enhanced. In addition, the high resistance layer 18 is continuously formed from one to another of the end faces 10a of the semiconductor layer 10 (see FIG. 2).

As shown in FIG. 6B, the high resistance layer 18 has an opening 18a. The opening 18a is arranged so as to overlap with the opening 16a of the window structure region 16. Specifically, the opening 18a is formed at an identical position of the opening 16a and has an identical width w2. The width w2 is smaller than the width w1 of the ridge waveguide 15.

However, a width of the opening 18a may be different from the width of the opening 16a of the window structure region 16. In that case, the width of the opening 18a is desirably smaller than the width of the opening 16a and greater than the width w1 of the ridge waveguide 15.

The high resistance layer 18 is formed by ion implantation of a specific element in the process, for example, after the window structure region 16 is formed and before the convex part configuring the ridge waveguide 15 is formed. The element includes at least one kind of Si, B, or H, for example. A method of manufacturing a semiconductor laser including the high resistance layer 18 will be described in other embodiment 4 described later.

Note that the high resistance layer 18 may be formed before the window structure region 16 is formed, and thereafter the window structure region 16 may be formed.

According to this embodiment, the similar effect in the above-described embodiment 1 is provided and the inhibition effect of the leak current to the window structure region 16 can be enhanced by arranging the high resistance layer 18 as well.

4. Embodiment 3

Figure 7A:
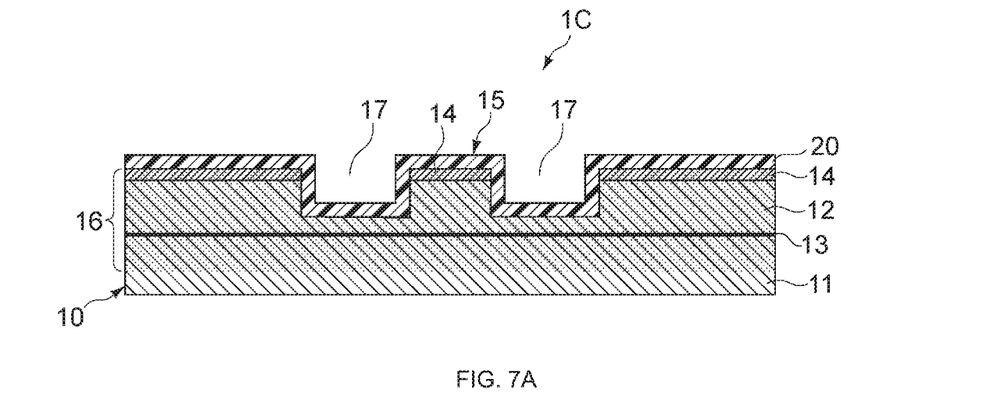
FIG. 7A shows a cross-section of an end face region of a semiconductor layer of a semiconductor laser according to an embodiment 3.
Figure 7B:
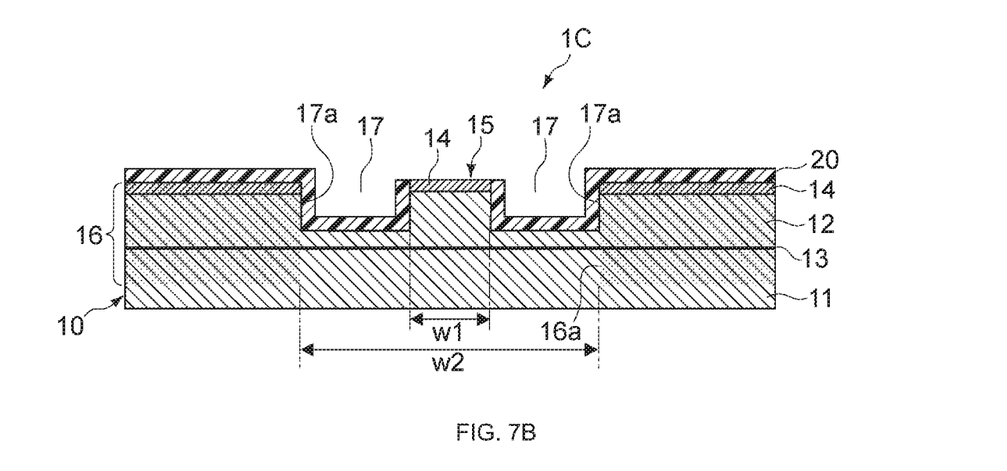
FIG. 7B shows a cross-section excluding the end face region of the semiconductor layer.

FIG. 7A is a cross-sectional view showing an end face region of a semiconductor layer of a semiconductor laser according to an embodiment 3. FIG. 7B is a cross-sectional view showing a region excluding the end face region of the semiconductor layer.

The semiconductor layer 10 of a semiconductor laser 1C has a concave part pair 17 and 17 formed by sandwiching the ridge waveguide 15 along the ridge waveguide 15. As shown in FIG. 7B, the width w2 of the opening 16a of the window structure region 16 is substantially matched with a width between respective wall faces 17a and 17a of the concave part pair 17 and 17 (inner wall face at outer sides facing to ridge waveguide 15).

A method of forming the ridge waveguide 15 and the concave part 17 pair will be described in embodiment 4 later.

Since the ridge waveguide 15 is configured by forming the concave part 17 pair, a height position of the ridge waveguide 15 can be identical to a surface position of the semiconductor layer 10 on which no concave part 17 is formed. Accordingly, as the ridge waveguide 15 does not become a most projected part from the surface of the semiconductor layer 10, stress concentration on the ridge waveguide 15 can be relaxed when the semiconductor laser 1C is junction-down mounted to a circuit board.

5. Embodiment 4

5. 1) Structure of Semiconductor Laser

Figure 8A:
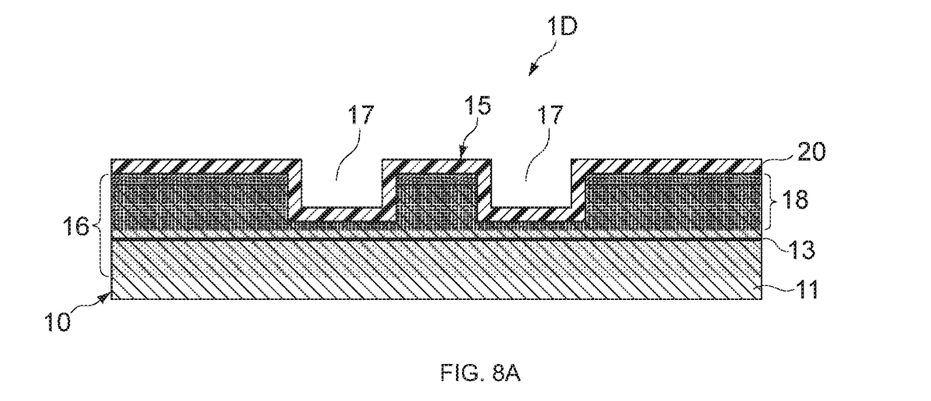
FIG. 8A shows a cross-section of an end face region of a semiconductor layer of a semiconductor laser according to an embodiment 4.
Figure 8B:
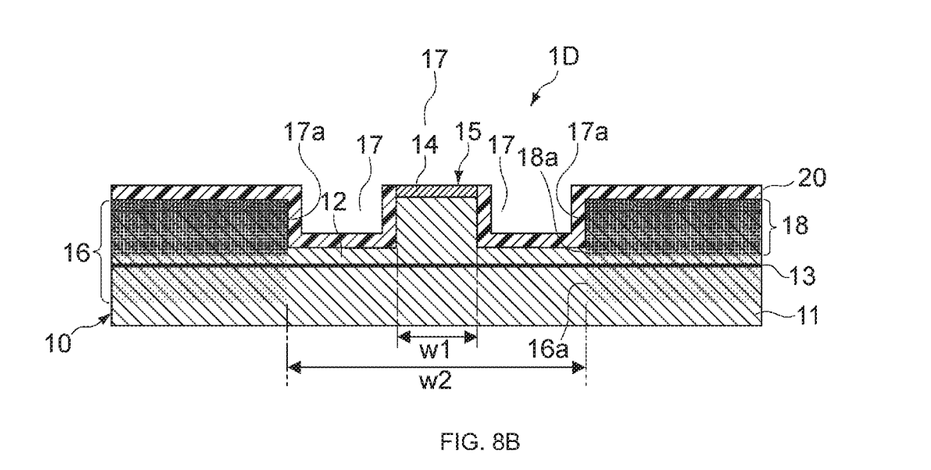
FIG. 8B shows a cross-section excluding the end face region of the semiconductor layer.

FIG. 8A is a cross-sectional view showing an end face region of a semiconductor layer of a semiconductor laser according to an embodiment 4. FIG. 8B is a cross-sectional view showing a region excluding the end face region of the semiconductor layer.

The semiconductor layer 10 of a semiconductor laser 1D has a mode that the embodiment 2 is combined with the embodiment 3. Specifically, the semiconductor layer 10 includes the ridge waveguide 15 formed by the concave part 17 pair, the window structure region 16, and the high resistance layer 18. As shown in FIG. 8B, the width w2 of the opening 16a of the window structure region 16 is substantially identical to the width of the opening 18a of the high resistance layer 18, but may be different.

According to this embodiment, effects are provided by the mode that the embodiment 2 is combined with the embodiment 3.

5. 2) Manufacturing Processes of Semiconductor Laser

FIGS. 9A 9B, 9C, 9D, 10A, 10B, 10C, and 10D show the manufacturing processes of the semiconductor laser 1D in order. Firstly, as described above by using FIGS. 4A, 4B, 4C, and 4D, Zn is diffused in a predetermined region of the semiconductor layer 10 to form the window structure region 16.

Figure 9A:
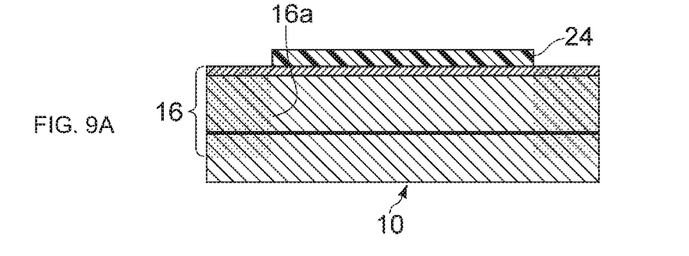
FIGS. 9A, 9B, 9C, and 9D show the manufacturing processes of the semiconductor laser according to the embodiment 4 in order followed by FIG. 4D.

Next, as shown in FIG. 9A, resist 24 is patterned depending on a shape of the opening 16a of the window structure region 16.

Figure 9B:
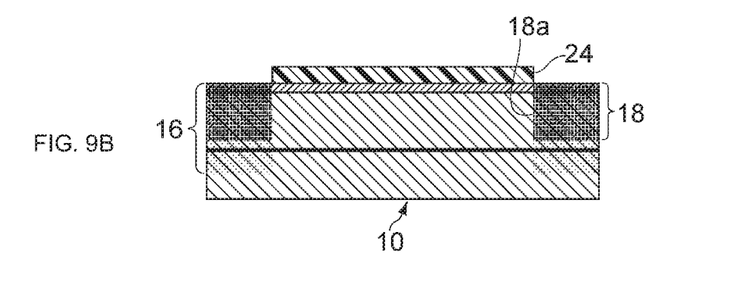
Figure 9C:
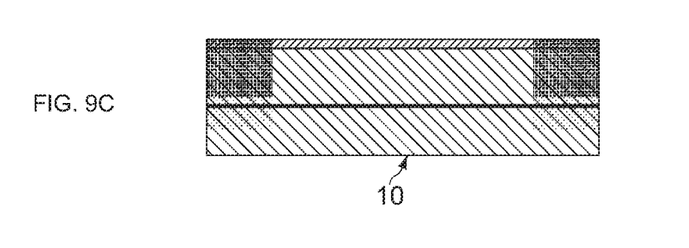

As shown in FIG. 9B, ion is implanted by using a mask as the resist 24 to form the high resistance layer 18. As shown in FIG. 9C, the resist 24 is removed.

Figure 9D:
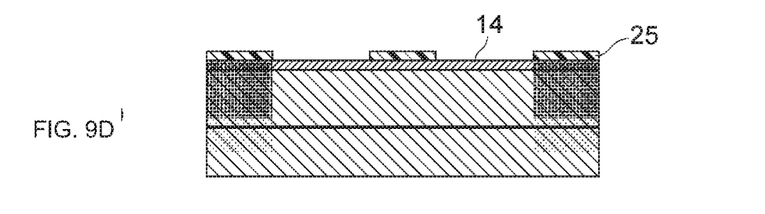
Figure 10A:
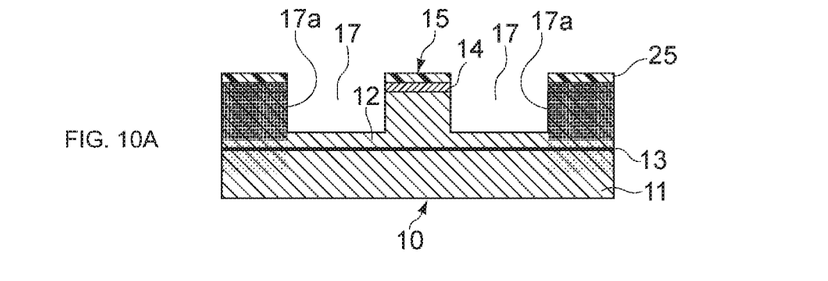
FIGS. 10A, 10B, 10C, and 10D show the manufacturing processes of the semiconductor laser according to the embodiment 4 in order followed by FIG. 9D.

As shown in FIG. 9D, an insulation film 25 is formed on the contact layer 14 of the semiconductor layer 10. As shown in FIG. 10A, the contact layer 14 and the second clad layer 12 are etched and removed to a predetermined depth using the insulation film 25 as a mask. Thus, the concave part 17 pair for configuring the ridge waveguide 15 is formed.

Figure 10B:
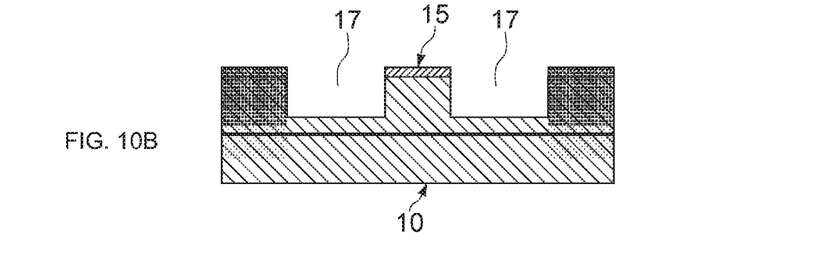
Figure 10C:
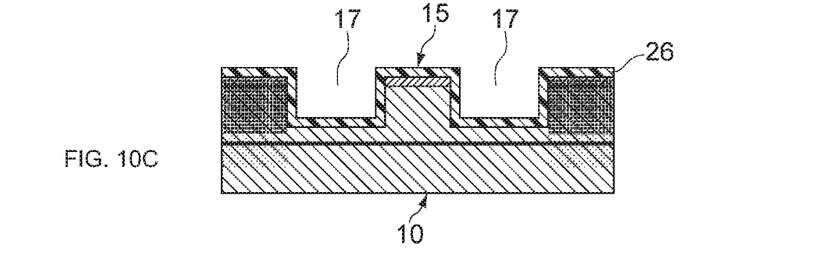

As shown in FIG. 10B, the insulation film 25 is removed, and as shown in FIG. 10C, an insulation film 26 is formed on the semiconductor layer 10.

Figure 10D:
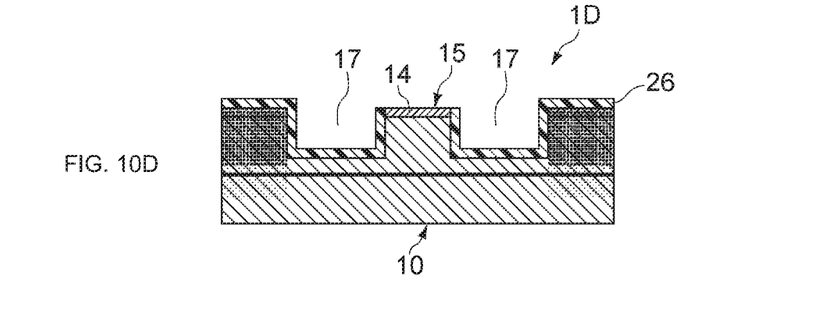

As shown in FIG. 10D, the insulation film 26 on the contact layer 14 is removed. Thereafter, an electrode layer (not shown) is formed on the contact layer 14 by vapor deposition or sputtering. In addition, electrodes are formed at a substrate side by the same method. In the above-described way, the semiconductor laser 1D is formed.

6. Embodiment 5

Figure 11A:
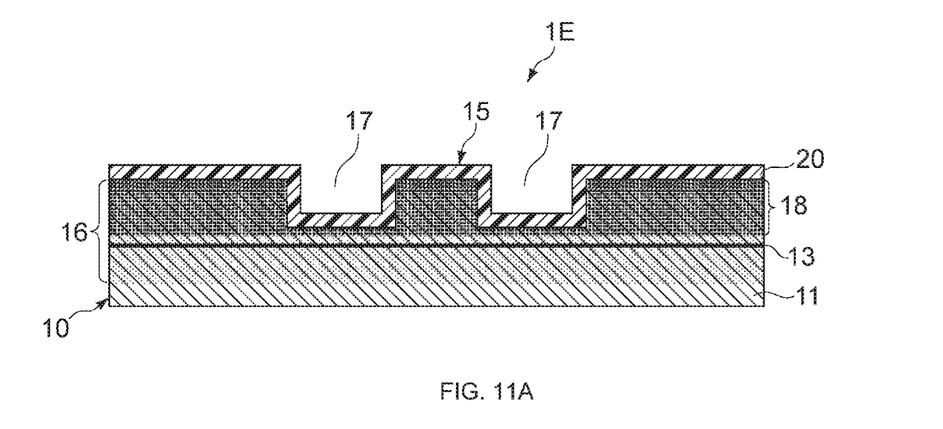
FIG. 11A shows a cross-section of an end face region of a semiconductor layer of a semiconductor laser according to an embodiment 5.
Figure 11B:
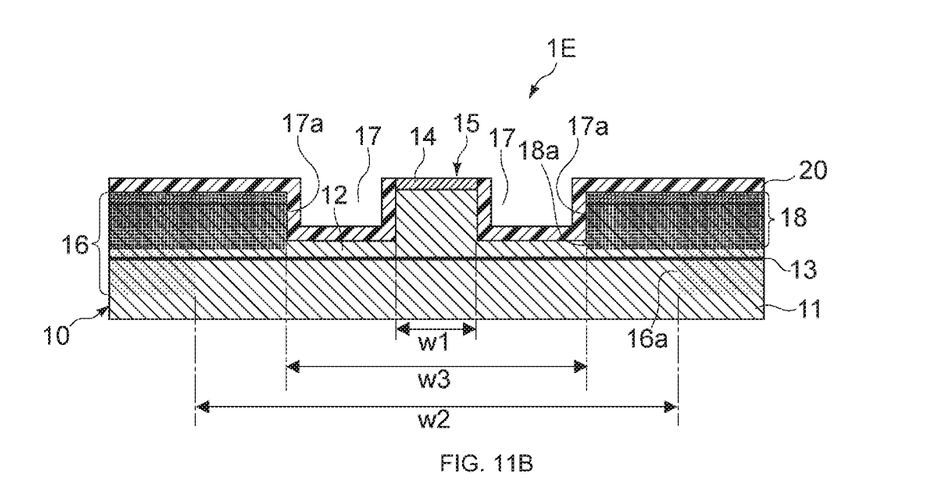
FIG. 11B shows a cross-section excluding the end face region of the semiconductor layer.

FIG. 11A is a cross-sectional view showing an end face region of a semiconductor layer of a semiconductor laser according to an embodiment 5. FIG. 11B is a cross-sectional view showing a region excluding the end face region of the semiconductor layer.

As shown in FIG. 11B, in the semiconductor layer 10 of a semiconductor laser 1E, a width w3 of the opening 18a of the high resistance layer 18 is smaller than the width w2 of the opening 16a of the window structure region 16. The width w3 is substantially matched with a width between the respective wall faces 17a at the outer sides of the concave part 17 pair and is greater than the width w1 of the ridge waveguide 15.

According to this embodiment, effects are provided by the mode that the embodiment 2 is combined with the embodiment 4 and the leak current to the window structure region 16 can be effectively inhibited.

7. Modification

The present technology is not limited to the above-described embodiments, and other various embodiments may be realized.

In each of the above-described embodiments, the ridge waveguide type semiconductor laser is illustrated. However, the present technology is applicable to a planar type semiconductor laser including no ridge. In the case of the planar type, the width of the waveguide in the horizontal direction can be defined as a width of a current-confined path configured by diffusing impurities in the horizontal direction, or, if the width is not uniform, can be defined as a maximum value thereof.

The window structure region 16 according to each of the above-described embodiments is continuously formed from one to another of the end faces 10a (see FIG. 2) but may be formed intermittently. Intermittently means that it is formed from one to another of the end faces 10a with at least one part being interrupted.

On the other hand, even if the window structure region is "continuously", there may be at least one groove (groove for forming non-window structure region) from one to another of the end faces 10a. The above is also similarly applied to the high resistance layer 18.

In the above-described embodiment 1, the window structure region 16 is not necessarily formed all over the end face region 10b in the vertical direction, as shown in FIGS. 2 and 3A. For example, the window structure region 16 may not be formed in a region at predetermined distances inwardly from both edges of the semiconductor layer 10 in the vertical direction. This is also similarly applied to other embodiments 2 to 5.

Although the ridge waveguide 15 according to each of the above-described embodiments is configured linearly from one to another end faces 10a, at least one part of the waveguide may be configured by a curve or a zigzag line.

In the above-described embodiments, as the semiconductor material, the GaAs-based materials are listed as examples but GaN-based materials may be used.

It is possible to combine at least two features among the features of the respective embodiments described above.

Note that the present technology can also have the following structures.

(1)

A semiconductor laser, including:
a semiconductor layer including end faces, at least one of the end faces being configured as a light emission end face, in which
the semiconductor layer includes
a waveguide having a first width extended between the end faces, and
a light window structure region including an opening having a second width greater than the first width arranged along the waveguide, the light window structure region formed continuously or intermittently from one to another of the end faces.

(2)
The semiconductor laser according to (1), in which
the semiconductor layer includes an active layer, a first clad layer arranged at a substrate side, and a second clad layer arranged at an opposite side of the first clad layer with respect to the active layer.

(3)
The semiconductor laser according to (2), in which
the window structure region is arranged in a depth that reaches from the second clad layer to the first clad layer via the active layer.

(4)
The semiconductor laser according to (2) or (3), in which
the waveguide is a ridge waveguide.

(5)
The semiconductor laser according to (4), in which
the ridge waveguide has tapered or reverse tapered side faces extended from one to another of the end faces.

(6)
The semiconductor laser according to (4) or (5), in which
the semiconductor layer has a concave part pair formed by sandwiching the ridge waveguide along the ridge waveguide.

(7)
The semiconductor laser according to any one of (4) to (6), in which
the semiconductor layer has further a high resistance layer, the high resistance layer being arranged along the waveguide, formed continuously or intermittently from one to another of the end faces, and arranged in the second clad layer of the window structure region from a surface opposite to a side in which the active layer is arranged to a position shallower than the active layer.

(8)
The semiconductor laser according to (2) or (3), in which
the semiconductor layer has further a high resistance layer, the high resistance layer being arranged along the waveguide, formed continuously or intermittently from one to another of the end faces, and arranged in the second clad layer of the window structure region from a surface opposite to a side in which the active layer is arranged to a position shallower than the active layer.

(9)
The semiconductor laser according to any one of (4) to (7), in which
the semiconductor layer is configured to match a center of the waveguide in a width direction with a center of the opening in a width direction.

(10)
The semiconductor laser according to (9), in which
the first width that is a width of the ridge waveguide is 0.5 µm or more and 5 µm or less, and
the second width is 5 µm or more and 40 µm or less.

(11)
The semiconductor laser according to (7) or (8), in which
the high resistance layer has an opening arranged so as to overlap with the opening of the window structure region.

(12)
The semiconductor laser according to (11), in which
a width of the opening of the high resistance layer is identical to or smaller than a width of the opening of the window structure region.

(13)
The semiconductor laser according to (7) or (8), in which
the high resistance layer includes at least one of Si, B, or H.

(14)
The semiconductor laser according to any one of (1) to (13), in which
the window structure region is a Zn diffusion region.

REFERENCE SIGNS LIST 1A, 1B, 1C, 1D, 1E semiconductor laser
10 semiconductor layer
10b end face region
10a end faces
11 first clad layer
12 second clad layer
13 active layer
14 contact layer
15 ridge waveguide
16a opening
16 window structure region
17 concave part pair
18 high resistance layer
18a opening

The invention claimed is:

1. A semiconductor laser, comprising:
a semiconductor layer including end faces, at least one of the end faces being configured as a light emission end face, wherein
the semiconductor layer includes
a waveguide having a first width extended between the end faces, and
a light window structure region including an opening having a second width greater than the first width arranged along the waveguide, the light window structure region formed continuously or intermittently from one to another of the end faces.

2. The semiconductor laser according to claim 1, wherein the semiconductor layer includes an active layer, a first clad layer arranged at a substrate side, and a second clad layer arranged at an opposite side of the first clad layer with respect to the active layer.

3. The semiconductor laser according to claim 2, wherein the light window structure region is arranged in a depth that reaches from the second clad layer to the first clad layer via the active layer.

4. The semiconductor laser according to claim 2, wherein the waveguide is a ridge waveguide.

5. The semiconductor laser according to claim 4, wherein the ridge waveguide has tapered or reverse tapered side faces extended from one to another of the end faces.

6. The semiconductor laser according to claim 4, wherein the semiconductor layer has a concave part pair formed by sandwiching the ridge waveguide along the ridge waveguide.

7. The semiconductor laser according to claim 4, wherein the semiconductor layer has further a high resistance layer, the high resistance layer being arranged along the waveguide, formed continuously or intermittently from one to another of the end faces, and arranged in the second clad layer of the light window structure region from a surface opposite to a side in which the active layer is arranged to a position shallower than the active layer.

8. The semiconductor laser according to claim 2, wherein the semiconductor layer has further a high resistance layer, the high resistance layer being arranged along the waveguide, formed continuously or intermittently from one to another of the end faces, and arranged in the second clad layer of the light window structure region from a surface opposite to a side in which the active layer is arranged to a position shallower than the active layer.

9. The semiconductor laser according to claim 4, wherein the semiconductor layer is configured to match a center of the waveguide in a width direction with a center of the opening in the width direction.

10. The semiconductor laser according to claim 9, wherein
the first width that is a width of the ridge waveguide is 0.5 µm or more and 5 µm or less, and
the second width is 5 µm or more and 40 µm or less.

11. The semiconductor laser according to claim 7, wherein
the high resistance layer has an opening arranged so as to overlap with the opening of the light window structure region.

12. The semiconductor laser according to claim 11, wherein
a width of the opening of the high resistance layer is identical to or smaller than the second width of the opening of the light window structure region.

13. The semiconductor laser according to claim 7, wherein
the high resistance layer includes at least one of Si, B, or H.

14. The semiconductor laser according to claim 1, wherein
the light window structure region is a Zn diffusion region.

* * * * *